United States Patent
Kovsh et al.

(10) Patent No.: US 11,594,854 B2
(45) Date of Patent: *Feb. 28, 2023

(54) OPTICAL COMMUNICATION INTERFACE

(71) Applicant: Arista Networks, Inc., Santa Clara, CA (US)

(72) Inventors: Alexey Kovsh, Saratoga, CA (US); David Towne, San Carlos, CA (US); Peter Parkinson, San Jose, CA (US); Andreas Bechtolsheim, Portola Valley, CA (US)

(73) Assignee: Arista Networks, Inc., Santa Clara, CA (US)

( * ) Notice: Subject to any disclaimer, the term of this patent is extended or adjusted under 35 U.S.C. 154(b) by 255 days.

This patent is subject to a terminal disclaimer.

(21) Appl. No.: 16/938,581

(22) Filed: Jul. 24, 2020

(65) Prior Publication Data

US 2022/0029380 A1   Jan. 27, 2022

(51) Int. Cl.
*H01S 5/02251* (2021.01)
*H01S 5/50* (2006.01)
(Continued)

(52) U.S. Cl.
CPC ........ *H01S 5/02251* (2021.01); *G02B 6/4204* (2013.01); *G02B 6/4292* (2013.01);
(Continued)

(58) Field of Classification Search
CPC .... H01S 5/02251; H01S 5/0651; H01S 5/146; H01S 5/3412; H01S 5/50; H01S 5/4025;
(Continued)

(56) References Cited

U.S. PATENT DOCUMENTS 5,477,368 A   12/1995   Eskildsen et al.
5,497,265 A   3/1996   Fontana et al.
(Continued)

FOREIGN PATENT DOCUMENTS

EP   3503437 B1   6/2019
WO   2017131898 A1   8/2017
WO   2019139144 A1   7/2019

OTHER PUBLICATIONS

Nonfinal Office Action for related U.S. Appl. No. 16/938,639, dated Mar. 9, 2022.
(Continued)

*Primary Examiner* — Leslie C Pascal
(74) *Attorney, Agent, or Firm* — Fountainhead Law Group PC

(57) ABSTRACT

Embodiments of the present disclosure include optical transmitters and transceivers with improved reliability. In some embodiments, the optical transmitters are used in network devices, such as in conjunction with a network switch. In one embodiment, lasers are operated at low power to improve reliability and power consumption. The output of the laser may be modulated by a non-direct modulator and received by integrated optical components, such as a modulator and/or multiplexer. The output of the optical components may be amplified by a semiconductor optical amplifier (SOA). Various advantageous configurations of lasers, optical components, and SOAs are disclosed. In some embodiments, SOAs are configured as part of a pluggable optical communication module, for example.

41 Claims, 11 Drawing Sheets

(51) Int. Cl.

| | | |
|---|---|---|
| *G02B 6/42* | (2006.01) | |
| *H01S 5/065* | (2006.01) | |
| *H04B 10/70* | (2013.01) | |
| *H04B 10/50* | (2013.01) | |
| *H01S 5/34* | (2006.01) | |
| *H01S 5/14* | (2006.01) | |
| *H04B 10/524* | (2013.01) | |
| *H04B 10/54* | (2013.01) | |
| *H04B 10/564* | (2013.01) | |

(52) U.S. Cl.
CPC .......... *G02B 6/4296* (2013.01); *H01S 5/0651* (2013.01); *H01S 5/146* (2013.01); *H01S 5/3412* (2013.01); *H01S 5/50* (2013.01); *H04B 10/503* (2013.01); *H04B 10/505* (2013.01); *H04B 10/506* (2013.01); *H04B 10/524* (2013.01); *H04B 10/541* (2013.01); *H04B 10/564* (2013.01); *H04B 10/70* (2013.01)

(58) Field of Classification Search
CPC ........ H01S 5/0085; H01S 5/12; H01S 5/5027; G02B 6/4204; G02B 6/4292; G02B 6/4296; G02B 6/421; G02B 6/4249; H04B 10/503; H04B 10/505; H04B 10/506; H04B 10/524; H04B 10/541; H04B 10/564; H04B 10/70
See application file for complete search history.

(56) References Cited

U.S. PATENT DOCUMENTS

| | | |
|---|---|---|
| 2003/0076567 A1 | 4/2003 | Matthews et al. |
| 2005/0271392 A1 | 12/2005 | Matsui et al. |
| 2009/0175626 A1 | 7/2009 | Yang |
| 2012/0163833 A1 | 6/2012 | Wang et al. |
| 2014/0049810 A1 | 2/2014 | McComb et al. |
| 2014/0147115 A1 | 5/2014 | Vall-Llosera et al. |
| 2014/0270626 A1 | 9/2014 | Isenhou et al. |
| 2016/0306117 A1 | 10/2016 | Middlebrook et al. |
| 2017/0098917 A1 | 4/2017 | Popovic et al. |
| 2017/0299808 A1 | 10/2017 | Zhou et al. |
| 2018/0090576 A1 | 3/2018 | Kim |
| 2018/0231807 A1 | 8/2018 | Zheng et al. |
| 2018/0335652 A1 | 11/2018 | Wen et al. |
| 2019/0181958 A1 | 6/2019 | Rylyakov et al. |
| 2019/0280775 A1 | 9/2019 | Gao |
| 2020/0166705 A1 | 5/2020 | Pelletier |
| 2020/0194964 A1 | 6/2020 | An |
| 2021/0006044 A1 | 1/2021 | Hong et al. |

OTHER PUBLICATIONS

Kovsh, A.R. et al., "InAs/InGaAs/GaAs quantum dot lasers of 1.3 mm range with enhanced optical gain," Journal of Crystal Growth, Apr. 2003, 729-736, 8 pages.

Kovsh, A. et al., "Quantum dot laser with 75 nm broad spectrum of emission," Optics Letters, Apr. 1, 2007, 3 pages.

Kovsh, A. et al., "Quantum dot comb-laser as efficient light source for silicon photonics," Proceedings of SPIE—The International Society for Optical Engineering, vol. 6996, May 2008, 12 pages.

"Compound Semiconductor Magazine—Comb lasers target connectivity," vol. 14, No. 4, May 2008, 31 pages.

Gubenko, A. et al., "Error-free 10 Gbit/s transmission using individual Fabry-Perot modes of low-noise quantum-dot laser," Electronic Letters, vol. 43, No. 25., Dec. 6, 2007, 3 pages.

Krishnamoorthy, Ashok V. et al., "From Chip to Cloud: Optical Interconnects in Engineered Systems," Journal of Lightwave Technology, vol. 35, No. 15, Aug. 1, 2017, 13 pages.

Huyei, G. et al., "Damping and feedback characteristics of quantum dot semiconductor lasers," Proceedings of SPIE—The International Society for Optical Engineering, vol. 5452, Sep. 2004, 9 pages.

Akiyama, Tomoyuki et al., "Quantum-Dot Semiconductor Optical Amplifiers," Proceedings of the IEEE, vol. 95, No. 9, Sep. 2007, 10 pages.

Arista, Self-Assembled Semiconductor Quantum Dots & Aumento Concept Brief, 2021, 24 pages.

International Search Report and Written Opinion for International Appln. No PCT/US2021/042093 dated Oct. 28, 2021, 13 pages.

Lee, C.S., "High Performance Quantum Dot Laser WDM Arrays for Optical Interconnects" Dissertation, University of Michigan, Dec. 2012 (Dec. 2012), https://deepblue.lib.umich.edu/handle/2027.42/91442.

Alvaro Moscoso-Mártir et al., "8-channel WDM silicon photonics transceiver with SOA and semiconductor mode-locked laser" 14 pages, Sep. 17, 2018.

Alvaro Moscoso-Mártir et al., Scentific Reports, Silicon Photonics Transmitter with SOA and Semiconductor Mode-Locked Laser, 15 pages, Published online Oct. 24, 2017.

Related Application, U.S. Appl. No. 16/938,639, filed Jul. 24, 2020.

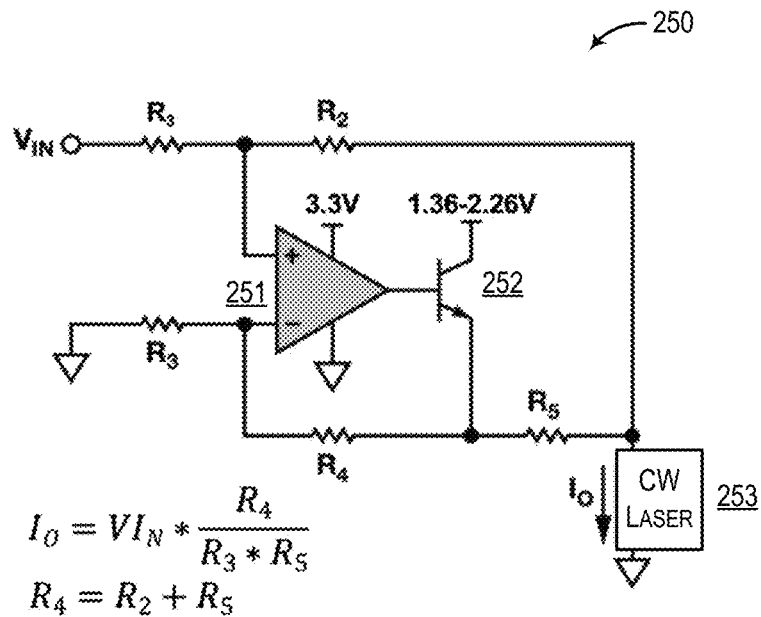

| Components | Power consumption, 30 mW lasers | Power consumption, 3 mW lasers + SOA | Delta |
|---|---|---|---|
| 8 CW DFB lasers<br>WPE 15% | 200 mW x 8<br>$I_{op}$=133mA, $V_f$=1.5V | 20 mW x 8<br>$I_{op}$=13mA, $V_f$=1.5V | |
| NPN transistors for the lasers | 67 mW x 8<br>$I_E$=133mA, $V_{CE}$=0.5V | 6.5 mW x 8<br>$I_E$=13mA, $V_{CE}$=0.5V | |
| OpAmp<br>$I_{SY}$=1.3mA, $V_S$=3.3V | 4.2 mW x 8 | 4.2 mW x 8 | |
| 8 mW output SOA chip<br>WPE 15% | | 53 mW<br>$I_{op}$=31mA, $V_f$=1.7V | |
| NPN transistor for SOA | | 16 mW<br>$I_E$=31mA, $V_{CE}$=0.5V | |
| OpAmp<br>$I_{SY}$=1.3mA, $V_S$=3.3V | | 4 mW | |
| Total power, including WPE of power supply line (80%) | ~ 340 mW<br>~ 2.7W for 8 channels | ~50 mW<br>~ 0.4W for 8 channels | ~0.3W per 100G<br>~2.3W for 800G |

FIG. 2B

OPTICAL COMMUNICATION INTERFACE

CROSS REFERENCE TO RELATED APPLICATIONS

The present disclosure related to concurrently filed U.S. patent application Ser. No. 16/938,639.

BACKGROUND

The present disclosure relates generally to optical communications.

An important application of optical communication is in computer networks connecting servers and storage systems in large data centers. For example, the majority of all network traffic today is generated by servers inside of large Cloud Data Centers that are connected to each other and to the Internet with high-speed Data Center Switches.

The throughput of network switches continues to grow at a significant rate with the the next generations of network switch chips providing throughput of 51.2 Tbps (Terabits per second). Such switch chips require a large number of lasers for optical communications.

One problem with today's high-speed optical communications is power and reliability. Today's optical communication modules use high power laser with high current densities that reduce the expected lifetime of the laser and thus the meantime between failure.

Another problem with today's high-speed optical communications is that the reliability is insufficient for using optical communications within the chassis since an optics failure would require a complete chassis replacement. To enable optical communication within the chassis, including so-called "co-packaged optics" (CPO) the reliability of the optics components would need to improve by at least an order of magnitude.

Various embodiments described herein reduce the power and to increase the reliability of optics communication for high-speed data transmission.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. Similar or same reference numbers may be used to identify or otherwise refer to similar or same elements in the various drawings and supporting descriptions.

FIG. 2B illustrates a comparison of power consumption.

DETAILED DESCRIPTION

Described herein are techniques for optical transmitters and optical communication systems. In the following description, for purposes of explanation, numerous examples and specific details are set forth in order to provide a thorough understanding of some embodiments. Some embodiments as defined by the claims may include some or all of the features in these examples alone or in combination with other features described below and may further include modifications and equivalents of the features and concepts described herein.

Figure 1:
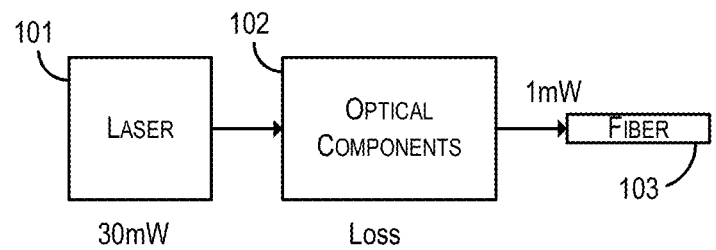
FIG. 1 illustrates an optical transmitter.

FIG. 1 illustrates an optical transmitter, which may be included as part of a transceiver in some embodiments. Contemporary optical transmitters may include a laser 101 coupled to a fiber optic cable 103 through optical components 102 (e.g., multiplexers, modulators, and the like). Laser 101 may be a laser diode, for example. One fundamental challenge for some laser based optical communication systems is the reliability of the laser diodes, which may be the most common failing component inside an optical transceiver. Reliability levels of electronic and photonics devices are typically measured by FIT (failure in time) or MTBF (mean time between failures) for systems and subsystems. Reliability can also be measured by MTTF (mean time to failure) for components. The term FIT is defined as a failure rate of 1 per billion hours. MTBF is equal to 1 divided by FIT.

For example, some contemporary optical transceivers running at high bandwidth are 400 Gbps transceivers typically using four different optical channels running at 100 Gbps with a PAM4 modulation scheme. For a network switch with 51.2 Tbps bandwidth, there is a need for 512 diode lasers to support 512 100 Gbps channels. Assuming MTTF of a single laser diode of 10,000,000 hrs., the MTBF of the entire system may be less than 20,000 hrs., not taking into account potential failures of all other electronic and photonic components. Such a failure rate is not satisfactory for large data center applications.

An additional challenge of some optical communication systems is the high power density generated by electronics and photonics devices. For example, the overall power of a 51.2 Tbps switch chip and related components for optical transmission packaged on one board is projected to exceed 1 kW, resulting in high component temperatures. High temperature has a negative exponential effect on the lifetime of semiconductor devices, including lasers. The same is true for an optical transceiver with high bandwidth because the power may have to be dissipated in a relatively small volume.

Features and advantages of the present disclosure include an optical transmitter (or transceiver) including a laser coupled to a semiconductor optical amplifier (SOA). In some embodiments, a laser may be operated at lower power and current density levels to improve reliability. The output of the laser is coupled to a fiber through the SOA to achieve the appropriate amount of power at the fiber input. In some example embodiments, the SOA may be pluggable, such that reliability issues may be shifted to the SOA which can be easily replaced, for example. Additional example embodiments are illustrated below.

To transmit optical signals over optical fibers for a certain distance, a certain light power must be generated by the laser. A typical design of an optical transceiver and laser power levels are shown in FIG. 1. Here, a laser 101 generates an optical signal, which is coupled through optical components 102 (e.g., multiplexers and/or modulators). The optical signal is then coupled to a fiber optic cable 103 for transmission (receive path not shown). Laser power of laser 101 may be set by a link power budget because there are various losses within the optical components 102 in the optical path: from the laser transmitter (Tx) in the first module in the link to a photodetector in the receiver (Rx) in the second module of the link (not shown). These losses include insertion losses of light from the laser to all photonics elements on its path and attenuation within fiber optic cable 103. For example, at the current level of development of some optical component and laser technologies the overall loss of laser light going through optical components 102 may be above 15 dB, resulting in a requirement to generate about 30 mW of optical output laser power for one channel. This power may be achieved at about 120 mA drive current, for example. On the other side, the maximum length of a laser strip may be limited to 1-2 mm due to the presence of internal losses in the laser waveguide caused by free carrier absorption. This reduces differential efficiency for longer devices. In such a design the typical drive current density of some lasers 101 used conjointly with optical components 102 may be above 8,000 A/cm$^2$, significantly exceeding the threshold current density which is typically below 500 A/cm$^2$.

Failure rates of semiconductor lasers strongly depend on p-n junction temperatures, optical power densities, and drive current densities. The typical formula for failure rate vs temperature, optical power, and drive current for the laser of a given size is as follows:

$$F(T_j, P, I) = F_{op} \cdot \exp\left(-\frac{E_A}{k_B}\left(\frac{1}{T_j} - \frac{1}{T_{op}}\right)\right) \cdot \left(\frac{P}{P_{op}}\right)^n \cdot \left(\frac{I}{I_{op}}\right)^m$$

where the function F is the failure rate (and MTTF (hrs.)=1/F), $F_{op}$ is a certain value of failure rate at certain p-n junction temperature, $T_{op}$, light power, $P_{op}$ and drive current $I_{op}$, $T_j$ is p-n junction temperature, P is laser optical power, I is laser drive current, $k_s$ is the Boltzmann constant, $E_A$ is the Arrhenius factor (activation energy), n is exponential optical power acceleration, and m is exponential current acceleration. Both optical power and current stimulates the formation, growth and propagation of non-radiative defects resulting in the degradation of laser power e.g. dark line defects or catastrophic optical mirror damage, or defects. For various types of semiconductor lasers, the sum of exponential acceleration factors "n" and "m" typically exceeds 4. Following the equation above, one can estimate for the set of 512 lasers mentioned earlier, which has an aggregated MTBF of 20,000 hrs. at the drive current and power required by a link budget in an example operating application in an optical network system, such as a data center, the MTBF would be at least 625 ($5^4$) times higher if the lasers are driven at 5 times lower drive currents. In this case the overall MTBF would be equal to 12,500,000 hrs., far exceeding current market acceptance levels.

Thus, certain embodiments of the present disclosure may run diode lasers at lower current densities from reliability and power consumption points of view, for example. For instance, the laser may be operated at a low power level corresponding to a reliability above a target threshold, for example. However, due to the presence of optical loss in the link including fiber attenuation, coupling loss, insertion loss of the receiver and others, the system may be required to deliver certain level of light power into the fiber on a transceiver side in order to achieve acceptable BER (bit-error-rate) at a given sensitivity of photodetector on the receiver part.

Figure 2A:
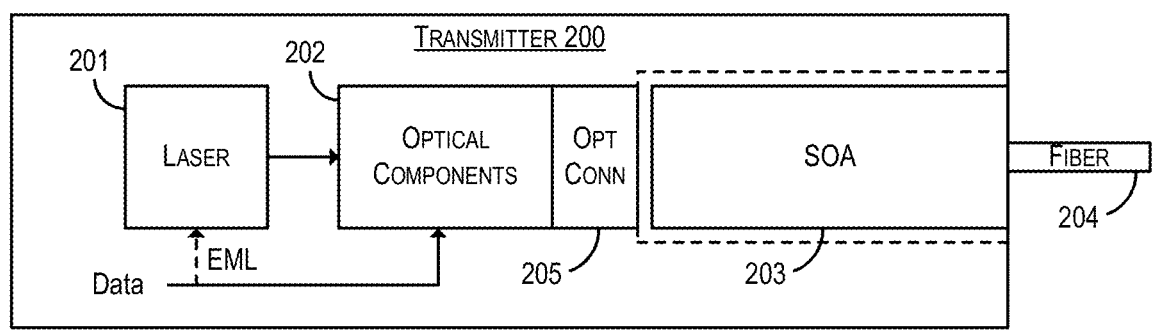
FIG. 2A illustrates an optical transmitter according to an embodiment.

FIG. 2A illustrates an optical transmitter according to an embodiment. Optical transmitter 200 includes laser 201, optical components 202, optical connector 205, and a semiconductor optical amplifier (SOA) 203 having an output coupled to a fiber optic cable 204. In various configurations, data may be converted from electrical signals to optical signals by driving the laser indirectly (e.g., via electro-absorption modulation) or by driving optical components 202 (e.g., integrated silicon based optical modulators). Non-direct modulation may improve the ability of a laser 201 to be operated at a low power, for example. A modulated optical signal may be coupled to a semiconductor optical amplifier 203, which boosts the power level to produce an optical signal with sufficient power to drive a fiber optic cable 204.

According to various embodiments, laser 201 may be implemented using a variety of laser technologies. For example, a diode laser may be a stand-alone chip or integrated together with optical components 202, for example. Low power operation and higher reliability may be particularly useful for non-direct modulated lasers, for example. In some embodiments, laser 201 may be a hybrid silicon laser with a III-V gain chip bonded onto a chip with a reflecting mirror made of optical gratings on silicon waveguides from both sides of the laser, for example. Other examples may be indirectly modulated electro-absorption modulated laser (EML) comprising a laser diode section configured to operate under a continuous wave (CW) condition and an electro-absorption modulation section to generate optical output signals. Yet other examples may be continuous wave (CW) lasers modulated by integrated silicon modulators, for example.

Optical components 202 may include waveguides, splitters, arrayed waveguide gratings, optical modulators, and/or photodetectors (e.g., for transceiver applications). In some embodiments, optical components 202 may be integrated on the same substrate, such as a semiconductor substrate, for example. Integrated silicon optical components are often referred to as "Silicon Photonics." A Silicon Photonics chip integrated with one or more diode lasers is an example of an "optical engine."

In some embodiments described in more detail below, electrical circuitry and optical components may be combined onto a common substrate, such as the same printed circuit assembly. This is sometimes referred to as co-packaged optics ("CPO"). CPO may reduce input/output (I/O) power by limiting electrical signaling to intra-package distances. CPO may reduce costs by increasing channel count per optical sub-assembly, by reducing the power required per bit, and by eliminating discrete transceiver packaging as well as minimizing the need for high-speed PCB traces. CPO may further support high-density optical faceplate connectors on a network device chassis, for example.

Accordingly, while the electrical data, laser, and optical components are illustrated in FIG. 2A as separate blocks, it is to be understood the such blocks may reside on one or more substrates or printed circuit assemblies, for example.

As mentioned above, one aspect of the present disclosure pertains to operating lasers at a low power level corresponding to a higher reliability, and coupling the optical signal through a semiconductor optical amplifier to increase the power level at the input to the optical fiber (e.g., to meet link power requirements).

From the equations above, it can be seen that lower power levels increase laser reliability. Accordingly, embodiments of the disclosure include configuring laser 201 to produce an optical signal with a first power level corresponding to a mean time to failure (MTTF) above a particular target value. SOA 203 is configured to produce the optical signal with a second power level configured to drive the optical fiber (e.g., corresponding to a predetermined power link budget), for example. Different laser technologies may be operated at different low power levels to achieve higher reliabilities and meet link power budgets as would be understood by those skilled in the art based on the present disclosure. Low power may correspond to a current density of the laser. For instance, low power operation continuous wave lasers modulated by external integrated silicon optical modulators may be configured with a current density below 4000 A/cm$^2$ per optical output channel (e.g., for each modulator driven by the laser). For example, a ratio between current density of the one or more continuous wave lasers to the number of optical channels driven by one laser may be below 4000 A/cm2 per channel.

The following are further examples of low power operation corresponding to higher reliability for optical communication applications. For a two section electro-absorption modulated DFB laser (e.g., an EML), the output power may be less than 1 mW (Po<1 mW). As another example, a hybrid silicon laser based on a III-V (e.g., InGaAs/InP) gain chip bonded on a silicon waveguide including wavelength selection elements may operate with an output power less than 10 mW (Po<10 mW). As yet another example, a continuous wave (CW) distributed feedback laser (DFB) modulated by external silicon photonic modulator may operate with an output power less than 10 mW. Additionally, a multiple-wavelength laser (comb laser or mode-locked laser) based on Quantum Dots (e.g., having more than 4 lasing modes) may operate with an output power less than 5 mW per channel. A quantum dot laser is a semiconductor laser that uses quantum dots as the active laser medium in its light emitting region. Quantum dots (QDs) are tiny semiconductor particles on the scale of nanometers in size, having optical and electronic properties that differ from larger particles due to quantum mechanics. Quantum dots have properties intermediate between bulk semiconductors and discrete atoms or molecules. Their optoelectronic properties change as a function of both size and shape as is understood by those skilled in the art. When referring to laser power, it is common to refer to the power of a laser mode. For instance, for a continuous wave (CW) distributed feedback laser (DFB), laser power is equal to the power of the laser mode. For a quantum dot comb laser, the power of a laser mode is equal to the laser power divided by the number of modes, for example.

In some embodiments, a ratio of the laser output power divided by the SOA output power is illustrative of low power laser operation. For example, for an electro-absorption modulated DFB laser the ratio of the laser output power to SOA output power may be in the range of 3-20 (e.g., less than 20), for example. However, for DFB lasers (e.g., one lasing wavelength per laser) or Quantum Dot (QD) based comb lasers (8, 16, 32 etc lasing wavelength per laser), which may be continuous wavelength (CW) lasers configured with Silicon Photonics, for example, the ratio of the laser output power to SOA output power may be in the range of 3-20 (e.g., less than 20), for example. For instance, in various embodiments, laser output power and SOA output powers may be as illustrated in TABLE 1 below:

TABLE 1

| Laser power, mW | SOA power, mW | Ratio (Laser/SOA) |
| --- | --- | --- |
| 15 | 1 | 15 |
| 10 | 1 | 10 |
| 5 | 1 | 5 |
| 3 | 1 | 3 |
| 1 | 1 | 1 |
| 30 | 2 | 15 |
| 20 | 2 | 10 |
| 10 | 2 | 5 |
| 5 | 2 | 2.5 |
| 1 | 2 | 0.5 |
| 15 | 0.5 | 30 |
| 10 | 0.5 | 20 |
| 5 | 0.5 | 10 |
| 2.5 | 0.5 | 5 |
| 1 | 0.5 | 2 |
| 10 | 0.25 | 40 |
| 5 | 0.25 | 20 |
| 2.5 | 0.25 | 10 |
| 1 | 0.25 | 4 |

In various embodiments, different lasers may be driven with different drive currents. The drive current relates to the output power. The drive current typically is above a threshold current for the laser to operate. Accordingly, for a low power/improved reliability laser according to embodiments herein, the drive current may be maintained close to the threshold current. For example, in other embodiments the drive current may not exceed the threshold current multiplied by 7. In some embodiments, the drive current may not exceed the threshold current multiplied by 4, for example.

Traditionally, Data Center computer networks have been considered "short reach" networks, where SOAs are not typically used. According to some embodiments, one or more lasers may generate optical signals with wavelengths in the O-band (e.g., around 1.3 um (i.e., 1.3 micrometers)). Accordingly, SOAs may amplify one or more wavelengths in the O-band, for example.

As mentioned above, higher reliability may be obtained by reducing drive current density and thereby laser power and including an SOA. However, adding components to a system, such as SOA 203, typically reduces reliability due to the additional potential failure of the added components. According to various embodiments, by reducing the power of the laser and including an SOA in the channel to drive the fiber, the system reliability increases relative to some high power laser systems. For instance, the increase in reliability of one or more lasers in an optical transmitter may be greater than the reduction in reliability from an SOA, and thus the system reliability increases. Additionally, even though the SOA may fail, in some embodiments, the SOA may be easily replaced by simply replacing the fiber cable with a new fiber and SOA, for example.

For some example embodiments, such as silicon photonics platforms, low input power from the laser may decrease the power consumption of integrated photonic components. For example, in some example integrated photonic systems, the majority of light (e.g., >90%) may be scattered inside of the silicon chip. Accordingly, lower absolute input power may improve the system performance due to lower potential crosstalk issues (e.g. on photodetectors on a receiver part) induced by the light, for example.

Additionally, the contribution to power consumption from an SOA module or chip(s) may be relatively small because the output power of an SOA may be substantially lower than a higher powered laser (e.g., 30 mW×8=240 mW for 8 CW DFB lasers used for 800G transceivers). FIG. 2B illustrates a comparison of power consumption for an example laser. One example current drive circuit is illustrated at 250, including an operational amplifier 251, NPN transistor 252, and resistors R2-R5 coupled to a continuous wave (CW) laser 253. Table 260 illustrates system power consumption for a high-powered laser without an SOA and a low powered laser with an SOA. As illustrated in table 260, the total power in this example is reduced from about 340 mW per channel to about 50 mW per channel, which in a networking application is a reduction in power of about 0.3 W per 100G or 2.3 W for 800G, for example. Accordingly, reducing the laser power may further reduce overall system power consumption.

In some embodiments, various formats of light modulation in the optical link of the present disclosure may be used, both for pluggable transceivers and co-packaged optics. The modulation formats include Non-Return-to-Zero (NRZ), Pulse-Amplitude Modulation (PAM) and Quadrature Amplitude Modulation (QAM) with coherent detection, for example.

Reducing the laser power may also be beneficial from an eye-safety point of view. For example, in the case of continuous wave (CW) lasers, which may pump a Silicon Photonics chip (e.g., inside a network switch), they may be operated at significantly lower power levels. Such lasers, as well as the pluggable modules including such lasers as described in further examples below, can meet Class 1 or 1M eye safety standards. The signal amplification needed to boost the power to the level required by the optical link power budget can be done via SOA chip(s) or module(s), for example.

Yet further, low power lasers move a portion of power consumption, heat, and cost of optics integrated with electronics toward the fiber output (e.g., from inside a network switch internally toward a faceplate as described in more detail below). Advantageously, lower heat load may also improve laser reliability.

As described in more detail below, features and advantages of the present disclosure may further include an SOA, which may be pluggable to or configured on a module with other optical components of a transceiver. As illustrated in FIG. 2A by the dashed lines, in this example embodiment SOA 203 may be selectively connected and disconnected from optical components 202 (e.g., plugged and unplugged by a user). SOA 203 may be permanently fixed to the fiber optic cable 204. Accordingly, when an SOA fails, it may be easily replaced by simply unplugging the cable connector, for example. In another embodiment, the SOA and integrated silicon optical components may be integrated on a single module. For example, a SOA chip may be integrated on a module that is also configured with other optical components, such as integrated silicon optical components, lasers, or both. In some embodiments, an SOA chip may be integrated on top of (e.g., bonded on) an integrated silicon optical components chip, for example, after a modulator in the integrated silicon optical components chip. These integrated modules may be inside a transceiver or chassis (as described further below) and may not be pluggable.

Figure 3A:
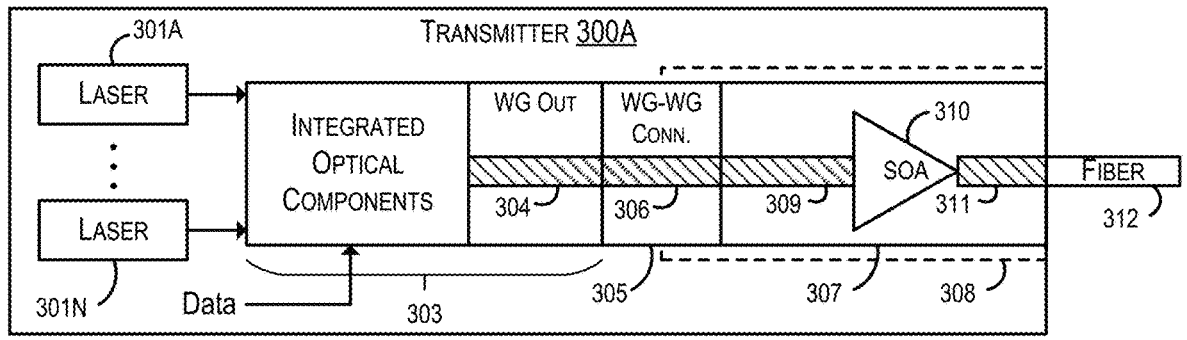
FIG. 3A illustrates an example optical transmitter with pluggable SOA according to some embodiments.
Figure 3B:
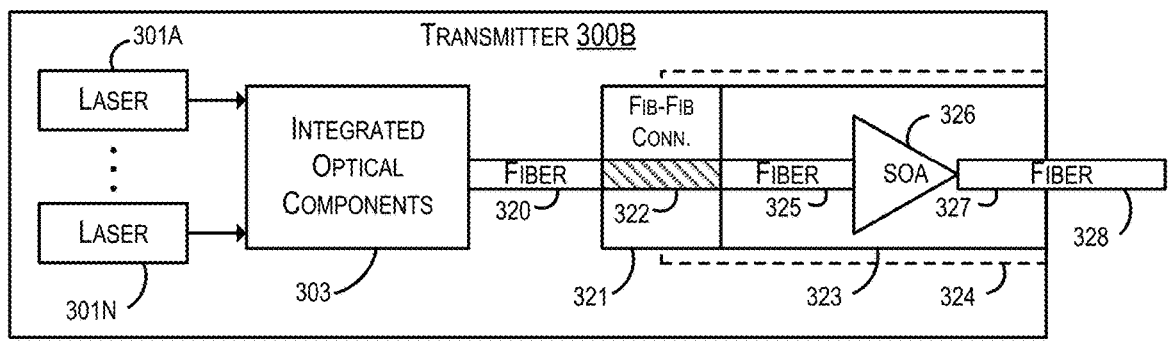
FIG. 3B illustrates another example optical transmitter with pluggable SOA according to some embodiments.

FIGS. 3A-B illustrate optical transmitters with pluggable SOAs according to various embodiments. Transmitter 300A may be a portion of a transceiver as described further below, for example. Referring to FIG. 3A, a plurality of lasers 301A-301N may each generate different optical wavelengths. The optical wavelengths are coupled to integrated silicon optical components 303 (Silicon Photonics), which may include multiplexers for combining the different wavelengths and modulators for modulating the wavelengths based on electrically encoded data to be transmitted, for example. In this example, an optical signal comprising a plurality of modulated wavelengths is output from integrated optical components 303 on an integrated waveguide 304. Integrated waveguide 304 may be a planar waveguide (PWG). In various embodiments, silicon waveguides in an integrated optical components chip may be coupled to polymer-based optical waveguides on a printed circuit board or fiber optic cables (e.g., for single mode or multimode depending on the specification of the links). In one embodiment, the waveguides may be polarization maintaining (PM) to meet polarization requirements of the optical link, for example. In FIG. 3A, the integrated optical components 303 are coupled to SOA 310 using polymer-based optical waveguides 304 and 309, which may be on printed circuit boards, for example. A waveguide-to-waveguide connector (WG-WG conn.) 305 may be configured to engage two printed circuit boards, for example. Connector 305 includes one or more coupling waveguides 306 to optically couple waveguides 304 and 309 to establish an optical link from lasers 301A-301N to an input of SOA 310, for example. An output of SOA 310 is coupled to a waveguide 311, which in turn is coupled to a fiber optic cable 312. Fiber optic cable 312 may be fixedly attached to a module 307 comprising SOA 310 and waveguides 309 and 311. Module 307 is configured to connect to WG-WG connector 305 so that the SOA and fiber are pluggable (e.g., into a socket 308), for example.

FIG. 3B illustrates another example optical transmitter 300B with pluggable SOA according to various embodiments. In this example, an output of integrated optical components 300B is coupled together using fiber optic cables. For example, fiber optic cable 320 is coupled to one input of a fiber-to-fiber connector 321, which engages two printed circuit boards, for example. Connector 321 includes one or more coupling waveguides 322 to optically couple fibers 320 and 325 to establish an optical link from lasers 301A-301N to an input of SOA 326, for example. An output of SOA 326 is coupled to fiber optic cable 328. Fiber optic cable 328 may be fixedly attached to a module 323 (comprising SOA 326 and fibers 325 and 327) and configured to connect to fiber-to-fiber connector 321 so the SOA and fiber are pluggable (e.g., into a socket 324), for example.

While connectors 305 and 321 are shown here as connecting one pair of waveguides, it is to be understood that optical connectors 305 and 321 may connect multiple pairs of waveguides in various embodiments. Additionally, while FIG. 3A illustrates coupling optical components together using integrated waveguides and FIG. 3B illustrates coupling optical components together using fiber optic cables, various combinations of these approaches may also be used.

Optical transmitters and transceivers according to various embodiments may be used in a variety of applications. For example, one application of the concepts described herein is computer networking, such as in a Data Center. Data Center network topologies are typically characterized by the use of multiple layers of switches. Different layers of topology are typically called core, spine, and leaf. Switches on the lowest level are connected to the server or server rack. Embodiments of the present disclosure may be applicable for the switches of all topology levels, as well as to the servers, racks of several servers, or other network devices, for example.

Switches for large scale Data Centers and Enterprise Data Centers typically include data switching and routing managed by special integrated circuit (e.g., ASIC) chipsets. Traditionally, network traffic is delivered via printed-circuit board copper traces to the front panel to connectors for pluggable optical transceivers. Optical signals are delivered by optical fiber to another switch or rack unit with multiple servers. For very short distances coaxial electrical cables are also in use. The switches used in Data Centers today have faceplate-mounted pluggable optical transceiver modules. The signals from the ASICs (switch chipset, CPU, etc.) are delivered to transceivers by PCB interconnect traces.

Embodiments of the present disclosure may improve computer networks. In some embodiments, electrical I/O which drives the optical engines are shorter in length and can be optimized for intra-package reach while consuming low power. Advantageously, high-speed I/O may be transported on and off the package on optical fibers attached to the photonics components.

Figure 4:
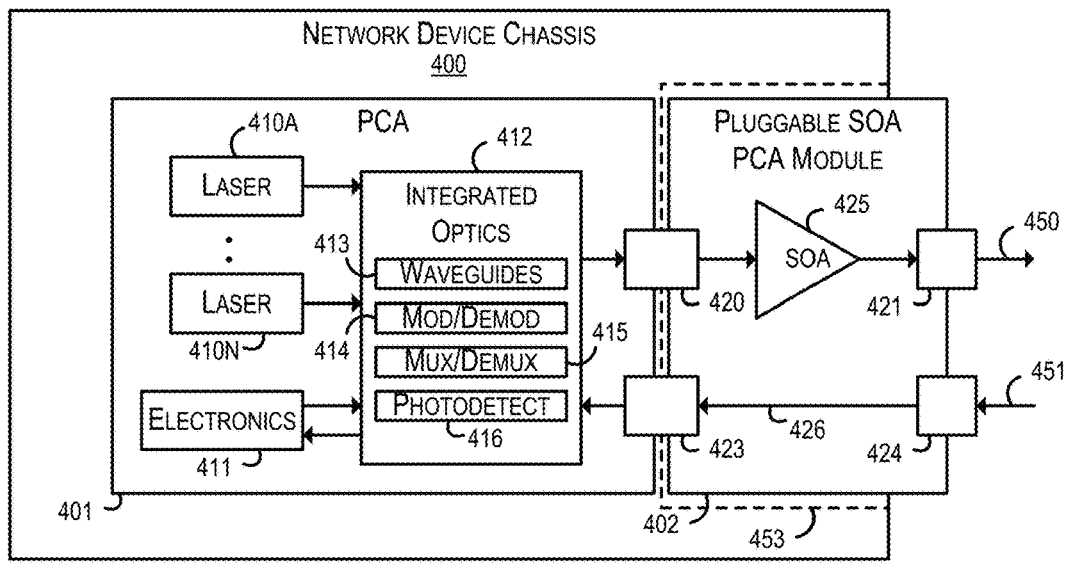
FIG. 4 illustrates a network device including a pluggable SOA module according to an embodiment.

FIG. 4 illustrates a network device including a pluggable SOA module according to an embodiment. In various embodiments, a network device may include a chassis 400, optics modules comprising lasers 410A-N configured to produce an optical signal, an integrated optical components unit 412 configured to receive the optical signal from the lasers 410A, semiconductor optical amplifiers (SOA) 425 configured to receive the optical signal from the integrated optical components unit 412, and an optical fiber 450 coupled to an output of an SOA 425, for example. As described above, the lasers are operable at a low power level corresponding to a higher reliability and one or more SOAs 425 increase the power level at the input to the optical fiber 450.

In this example, SOA 425 is configured on a pluggable printed circuit assembly (PCA) module. Chassis 400 may include a plurality of sockets, such as pluggable socket 453. Accordingly, SOA 425 is pluggable into one or more of the plurality of sockets to optically couple and decouple light signals, for example. The present example shows one pluggable SOA, but it is to be understood that multiple pluggable SOAs may be used.

This example also illustrates an optical transceiver. For instance, network device chassis 400 may include lasers 410A-N, integrated optics 412, and pluggable SOA 425 for transmission on fiber 450. Additionally, a receive path may include fiber 451 coupled to a waveguide 426, which is coupled to an input of integrated optics 412 through a WG-WG connector 423, for example. Accordingly, for a transceiver application, integrated optics 412 may include integrated waveguides 413, optical modulators/demodulators 414, optical multiplexers/demultiplexers 415, and one or more photodetectors 416.

In this example, integrated optics are configured on a PCA 401, and SOA 425 is configured on PCA 402. Accordingly, pluggability may be achieved using planar optical connectors 420 and 423, for example. Fiber optic lines 450 and 451 may be coupled to integrated waveguides on pluggable SOA module 402 using fiber-to-waveguide connectors 421 and 424, which may be fixed (non-pluggable). Integrated waveguides on PCA 402 may be coupled to integrated waveguides on PCA 401 using planar optical connectors 420 and 423, for example. In this example, some network device electronics 411, such as data switching and control hardware may be on the same PCA or on a different PCA.

Optical connectors according to various embodiments may include connectors mechanically configured to mate waveguides (e.g., on two different PCBs) with low optical loss of light travelling between waveguides (e.g., lower than 3 dB). Optical connectors may have high coupling efficiency over numerous mate/demate cycles and ambient temperature fluctuations for life-time of the system. The alignment between planar waveguides on PCBs and optical fiber is known to those skilled in the art, and various technologies may be used. For example, one approach may use silicon-based fixtures with V-groves and ferrule-sleeve-ferrule interfaces, providing coupling loss on a level of 1 dB. Similar technologies can be used for the coupling between planar waveguides embedded to different PCBs, for example. An optical connector may also provide protection from dust deposition on its optical element, for example, and may be in a form factor of an MPO connector for example.

Figure 5:
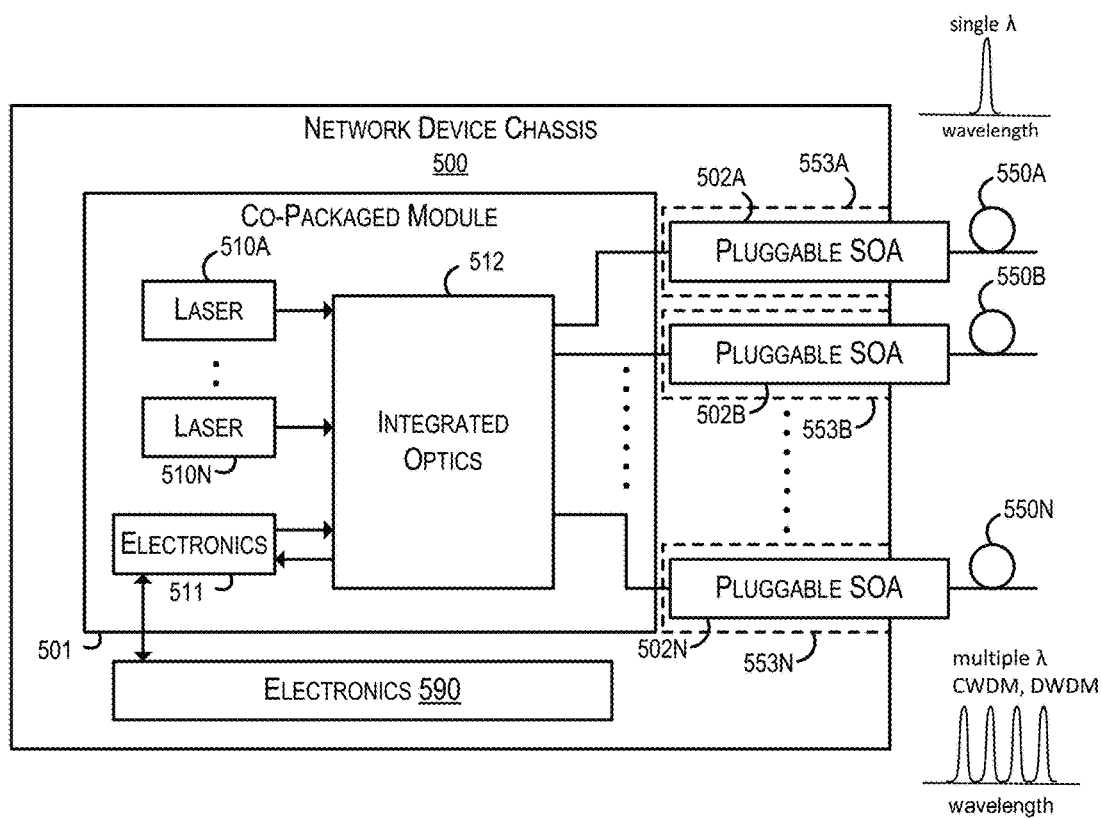
FIG. 5 illustrates an example of a co-packaged module coupled to pluggable SOAs according to another embodiment.

FIG. 5 illustrates an example of a co-packaged module 501 coupled to pluggable SOAs according to another embodiment. Here, a network device chassis 500 includes integrated circuits configured to switch data 511, lasers 510A-N, integrated optical components 512 co-packaged as a single module 501. Co-packaged optics refers to the coupling of optics with integrated circuits (e.g., an application specific integrated circuit, ASIC) in one package. Co-packaged optics module 501 is coupled to a plurality of pluggable SOAs 502A-N residing in chassis sockets 553A-N, which are in turn coupled to fibers 550A-N, for example. The lasers 510A-N, integrated optics 512, and pluggable SOAs 502A-N may be configured to transmit one or more wavelengths, including course wave division multiplexed wavelengths (CWDM) or dense wave division multiplexed wavelengths (DWDM), for example. In this example, a portion of the network device electronics 511 is included on the co-packaged module 501 (e.g., an integrated circuit or ASIC for performing data plane switching functions). Other network device electronics 590 may be configured on other PCBs inside the chassis, for example, such as integrated circuit for performing control plane functionality (e.g., a CPU), for example.

Figure 6:
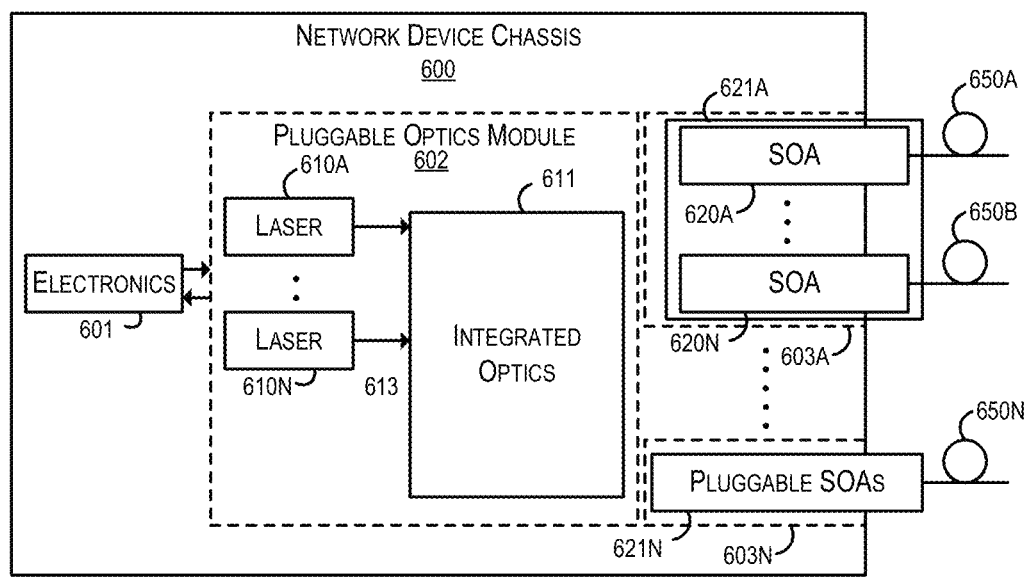
FIG. 6 illustrates an example of multiple pluggable modules according to another embodiment.

FIG. 6 illustrates an example of multiple pluggable modules according to another embodiment. In some embodiments, a plurality of SOAs (e.g., SOAs 620A-N) are in first pluggable modules and the lasers and integrated optics may be in one or more second pluggable modules, for example. In this example, network device chassis 600 includes sockets 603A-N configured to receive pluggable modules 621A-N each comprising a plurality of SOAs coupled to fibers 650A-650N. In one embodiment, all SOAs may be configured on one pluggable module. Further, lasers 610A-N and integrated optics 611 may be configured on a pluggable module 602 for easy replacement. In some embodiments, electronics 601 (e.g., a data plane ASIC for data packet switching and routing) may be included on pluggable module 602.

Figure 7:
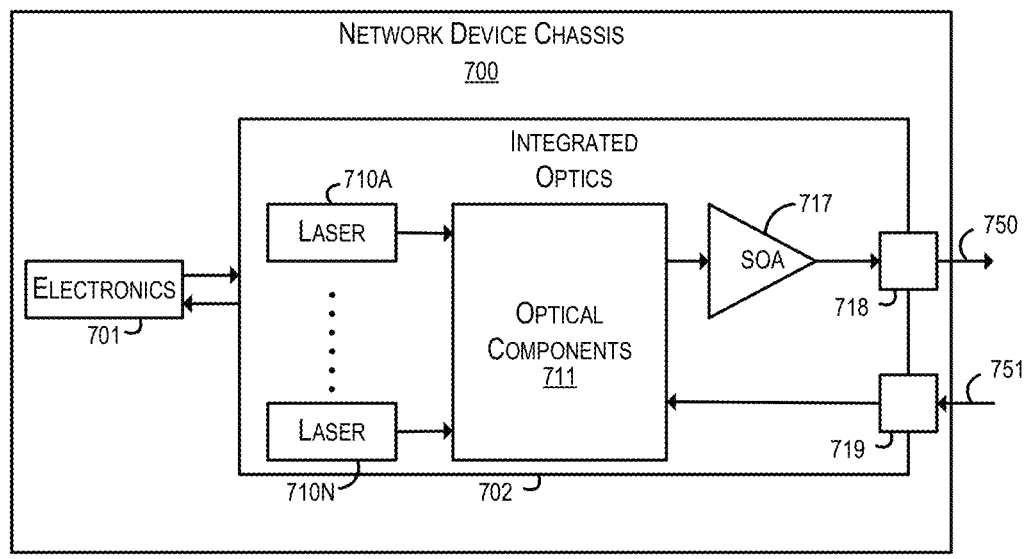
FIG. 7 illustrates a network device with an integrated optics module according to an embodiment.

FIG. 7 illustrates a network device with an integrated optics module according to an embodiment. In this example, one or more lasers 710A-N, at least one integrated optical components unit 711 (e.g., a silicon photonics chip) coupled to optical fibers 750, 751 by connectors 718, 719, and at least one semiconductor optical amplifier 717 are configured on a common substrate 702. The resulting module may or may not be pluggable in various embodiments. Module 702 and network device electronics 701 may be configured in network device chassis 700. Module 702 may send and receive electrical control and data signals for generating and receiving optical signals with very high data rates, for example.

Figure 8:
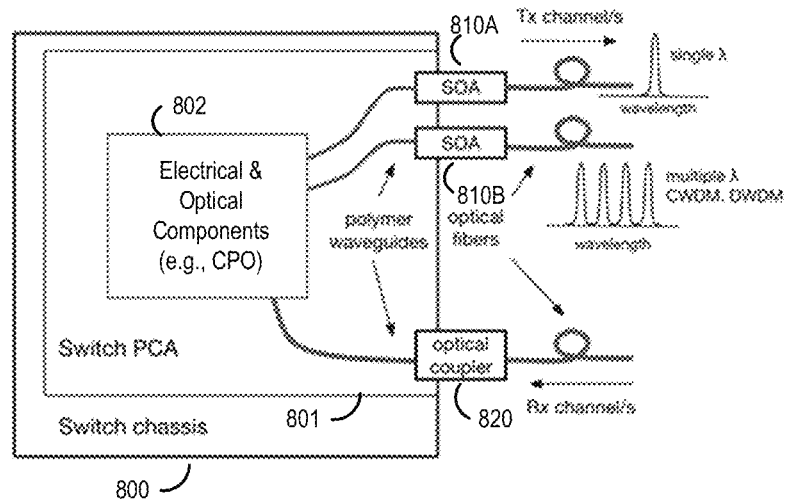
FIG. 8 illustrates a network device with pluggable optics according to another embodiment.

FIG. 8 illustrates a network device with pluggable optics according to another embodiment. In some embodiments, the optical channels also can be routed such that Tx channels go through the SOA module (a single channel per SOA, or multiple channels per SOA), whereas Rx signals to the network device are delivered by different optical fibers using a low-cost pluggable optical connector to pass the light into embedded waveguides on a device PCA, for example. In this example, a network device comprises a chassis 800, including one or more PCAs 801 including electrical and optical components 802. Pluggable SOAs 810A-N are configured to send optical signals (e.g., single wavelength or multiple wavelengths). In this example, the network device further comprises a pluggable optical coupler module 820 configured to receive an optical signal and couple the optical signal to at least one integrated optical components unit in the electrical/optical components 802. Accordingly, SOA transmitters, which may experience higher failure rates, may be easily replaced separately from optical receive channel components, which may have lower failure rates, for example.

Figure 9:
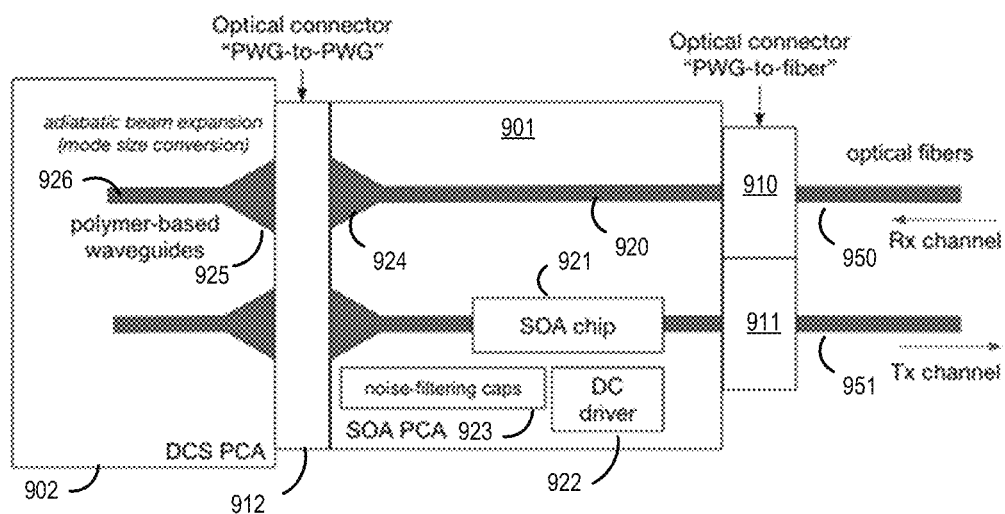
FIG. 9 illustrates an example configuration of printed circuit modules according to an embodiment.

FIG. 9 illustrates an example configuration of printed circuit modules according to an embodiment. In some embodiments, a network device may include one or more planar optical connectors configured to optically couple a first polymer waveguide on a first printed circuit assembly comprising the at least one integrated optical components module and a second polymer waveguide on a second printed circuit assembly comprising the at least one semiconductor optical amplifier. In this example, a network device includes a chassis (not shown), single or multiple PCAs 901-902, optical connectors 910-912 for passive optical alignment (optical couplers) in order to couple light between a planar waveguides (PWG) (e.g., WG 920 and WG 926) on SOA PCA 901 and PCAs 902, for example. Optical connectors 910 and 911 provide optical connections with the fibers 950 and 951, respectively. Waveguides on both PCAs may have a tapered beam expansion section (e.g., 924/925) to convert an optical mode of an optical signal. The expanded section may be configured large enough so that passive optical alignment can be used with low coupling loss. It is to be understood that other passive light coupling techniques can be used, including evanescent field light coupling, for example. PCA 901 has an SOA chip 921, which may be based on either InGaAsAl/InP Quantum Wells or InGaAs/AlGaAs Quantum Dots, for example. Both facets of the SOA chip may have Anti-Reflection Coating (AR). The waveguide coupled to the SOA chip might have a curved design on both sides of the chip making light reflection on the chip facets take place under an angle to enhance anti-reflection. In some example embodiments, the length of the SOA chip 921 may vary from 0.5 to 8 mm. SOA chip 921 may receive drive current from a direct current (DC) driver 922, for example. The SOA chip 921 may be single mode to support a single mode link, which may be used for longer reaches, or can be multimode for shorter reach multimode transmission, for example. On the receiver (Rx) line, the light travels from external fiber 951 through a polymer-based waveguide to the optical connector 912 and later to a polymer waveguide on PCA 901. A laser driver IC and all required passive and active components may be placed on the same PCB as described above, for example. In this example, a set of filtering capacitors 923 may be used to reduce the drive current noise (e.g., based on the overall link requirements). Thermoelectric coolers (TEC) can be placed inside of those SOA modules with high output power, whereas for moderate power levels an uncooled operation of SOA chip 921 may be used. A mounting scheme where all or several SOA modules are coupled to an external passive or active heatsink is also possible.

Figure 10:
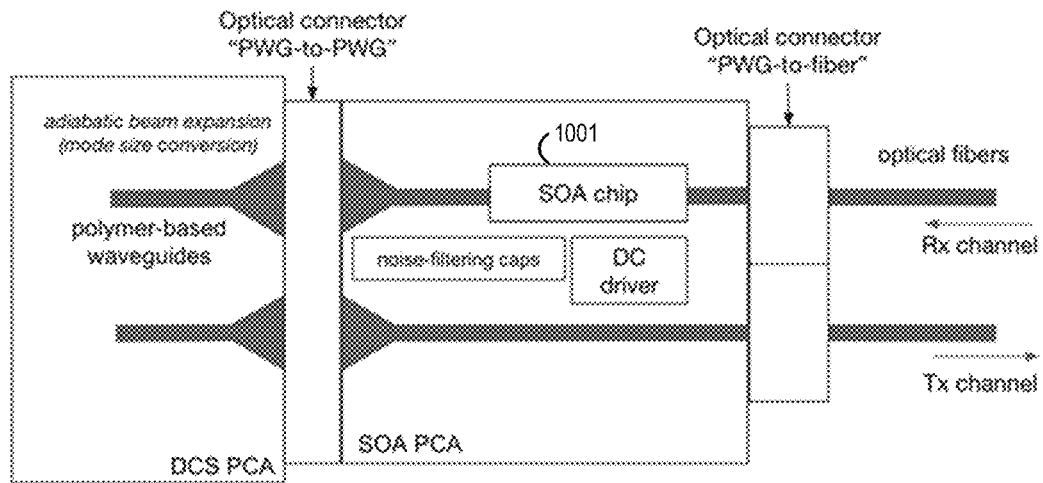
FIG. 10 illustrates an example configuration of printed circuit modules according to another embodiment.
Figure 11:
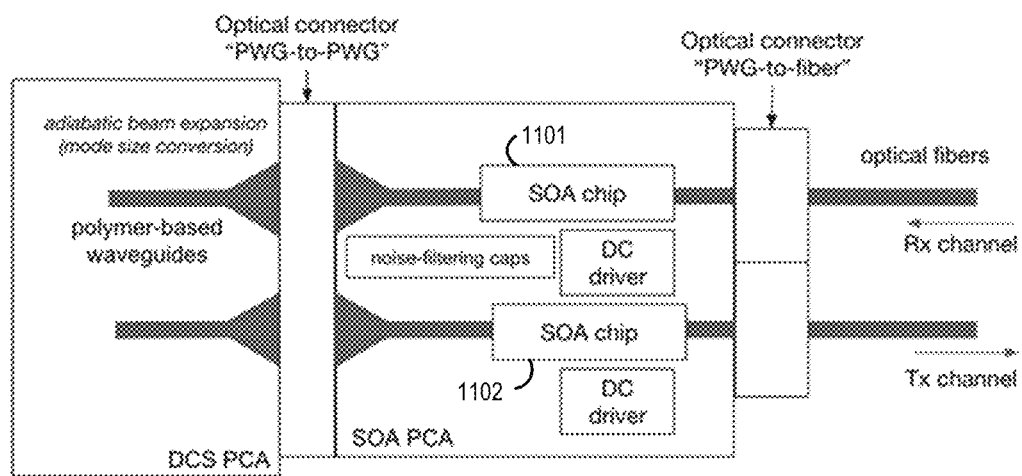
FIG. 11 illustrates an example configuration of printed circuit modules according to yet another embodiment.

FIGS. 10 and 11 illustrate example configurations of printed circuit modules according to alternative embodiments. In FIG. 10, an SOA chip 1001 is configured in the receive path. In FIG. 11, SOA chips 1101 and 1102 are configured in the receive and transmit paths, respectively.

Figure 12:
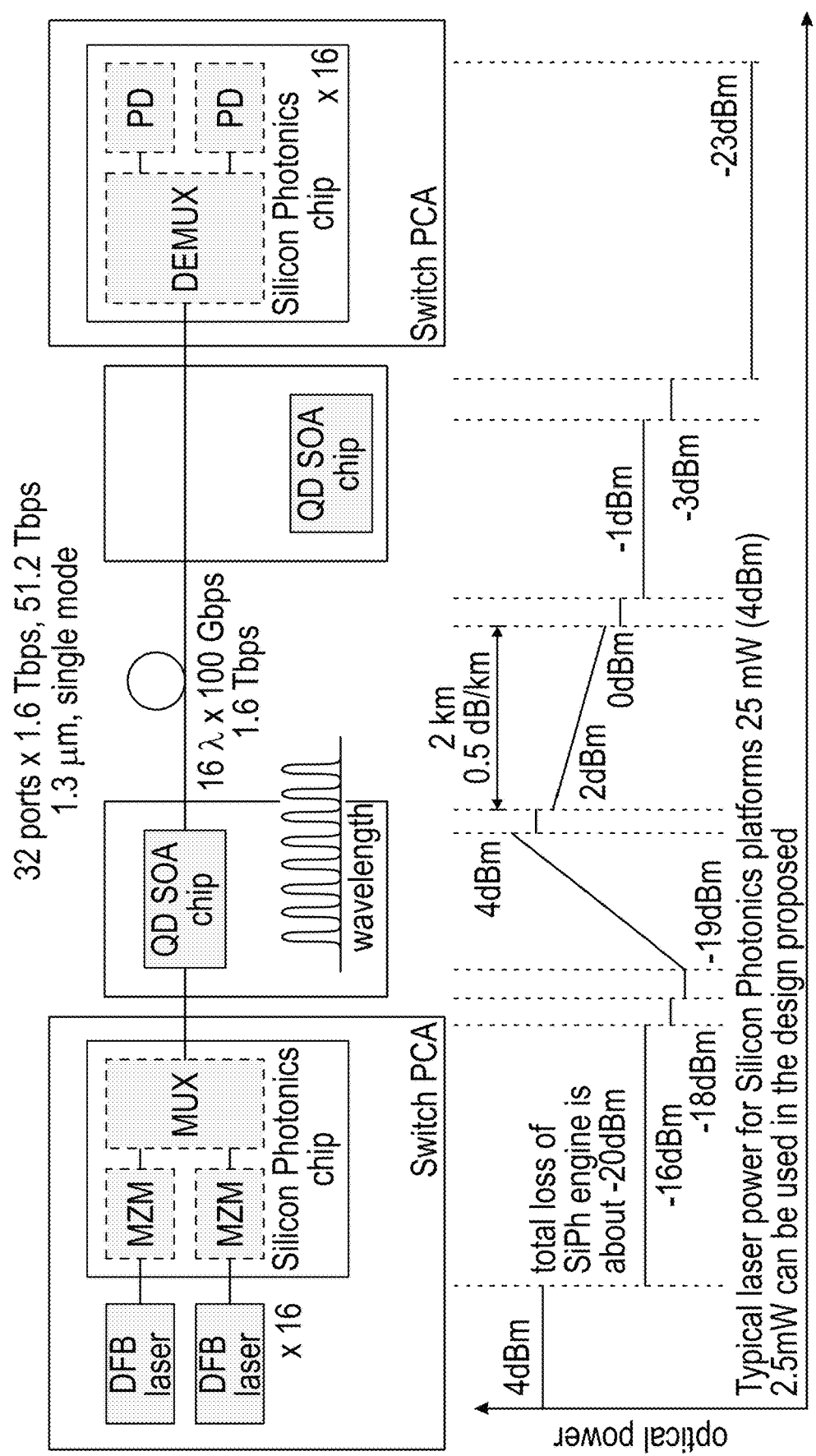
FIG. 12 illustrates an example power link budget estimate according to an embodiment.

FIG. 12 illustrates an example power link budget estimate according to an embodiment. In this example, DFB lasers are configured in a CPO module and driven at low output power in a 51.2 Tbps datacenter switch with 32 ports. Each port may have a bandwidth of 1.6 Tbps aggregated from 16×100 Gbps PAM4 channels. A single quantum dot (QD) SOA chip operates in a regime close to gain saturation (e.g., low differential gain) and amplifies all 16 lasing modes simultaneously without generation of additional mode partition noise as described above. The wavelengths are modulated using 16 Mach-Zahnder modulators (described further below), multiplexed onto a single waveguide, amplified and transmitted. Another receiver demultiplexes the wavelengths, which are then sensed by photodetectors. Losses from polymer-based waveguides embedded on the switch PCA and SOA PCA may be 0.05 dB/cm, for example, and are not taken into account. The coupling losses in this example are at a level of 1 dB for PWG-to-fiber and PWG-to-SOA chip coupling and 2 dB for PWG-to-PWG coupling. Typically, a continuous wave (CW) DFB laser output power may be as high as 25 mW due to significant total insertion loss of the silicon photonics chip. Thus, the laser drive current density is well above the threshold current density. However, according to the present example embodiment, one can drive the laser at 10 times lower drive current, for example, because the optical signal is amplified in an SOA module pluggable to the switch. Reductions in drive current may be similarly applicable for QD Comb Lasers (e.g., with Silicon Micro-ring Resonators acting as modulators) and EML lasers, for example.

Figure 13:
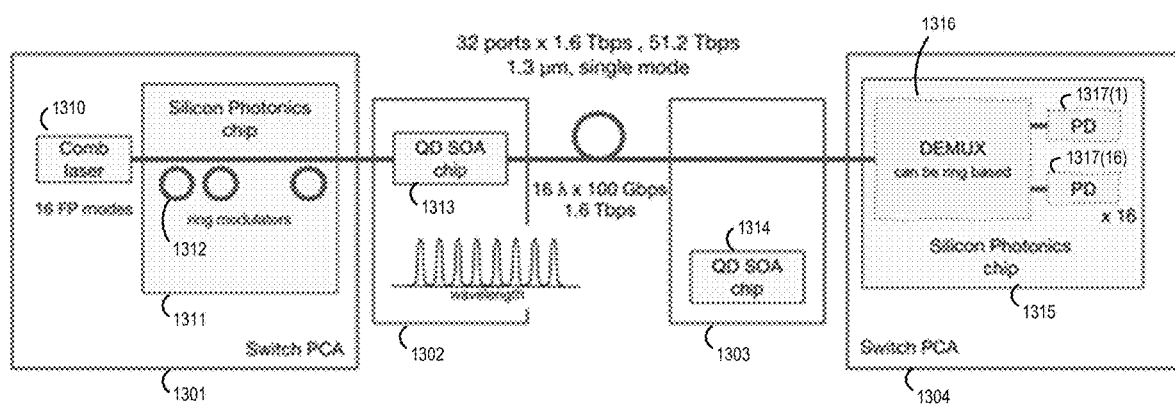
FIG. 13 illustrates an example network device including optical transceivers according to an embodiment.

FIG. 13 illustrates an example network device including optical transceivers according to an embodiment. In this example, a network switch comprises a PCA 1301 including a comb laser 1310 generating 16 wavelengths (e.g., Fabry-Pérot (FP) modes).

A comb laser (or frequency comb-based laser) is a light source with a spectrum consisting of frequency equidistant lines, each corresponding to one longitudinal cavity mode. For example, comb laser 1310 may be a monolithic comb-laser diode chip is based on InAs/InGaAs quantum dots in GaAs/AlGaAs materials system.

Accordingly, multiple wavelengths may be generated and modulated by a silicon photonics chip 1311. In this example, silicon photonics chip 1311 includes ring modulators 1312. Ring modulators are a type of optical ring resonator, which comprise a set of waveguides in which at least one is a closed loop coupled to some sort of light input and output. When light of the resonant wavelength is passed through the loop from an input waveguide, it builds up in intensity over multiple round-trips due to constructive interference and is output to the output bus waveguide which serves as a detector waveguide. Light in the ring may be modulated by electrically altering the optical properties of the ring, such as a coupling coefficient.

The output wavelengths of the modulator are coupled to a quantum dot SOA chip 1313 on a pluggable module 1302, amplified, and transmitted over a fiber. Another switch may include a pluggable module 1303 comprising an SOA chip 1314 for amplifying the received wavelengths. A switch PCA 1304 includes a photonics chip 1315 comprising a demultiplexer 1316 (which may also be ring based) and 16 phase detectors 1317(1)-1317(16). In the present example, because additional lasing lines are coming at no cost for comb lasers and multiple lines can be amplified by a single SOA chip based on QDs, certain embodiments may advantageously use more lines modulated at lower speed, because the cost and power consumption of driving electronics is higher for higher speed. For example, 16 lasing modes modulated at 100G PAM4 (25G) to get 1.6 Tbps aggregated data rate may be used in some embodiments.

Figure 14:
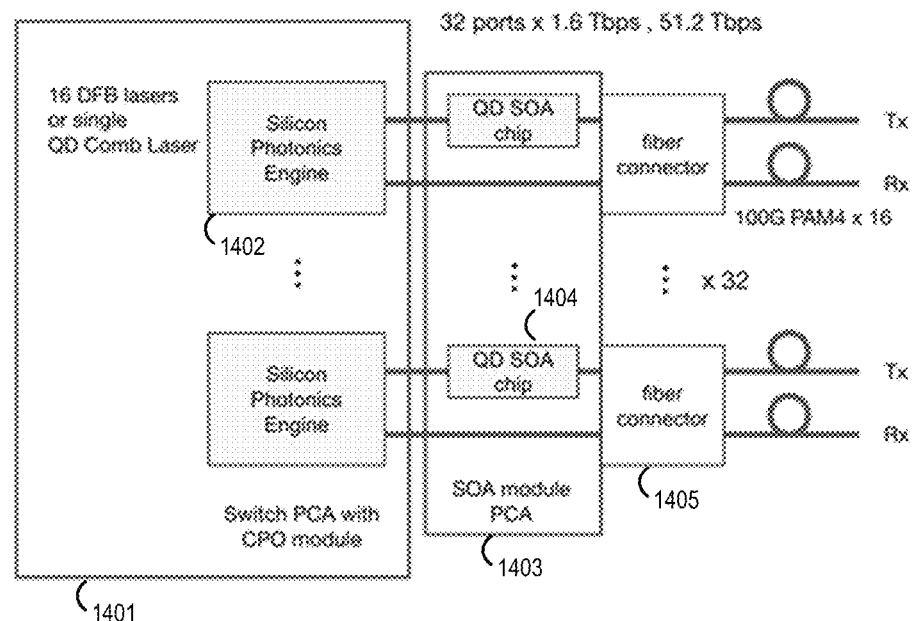
FIG. 14 illustrates another example network device with pluggable optical components according to an embodiment.

FIG. 14 illustrates another example network device with pluggable optical components according to an embodiment. As mentioned above, one or more SOAs may be pluggable. In this example, all the SOA chips are configured on one module. Here, a CPO module on a network switch PCA 1401 includes a plurality of silicon photonics engines (e.g., lasers and integrated optical components; electronics not shown), such as engine 1402, which may include 16 CW DFB lasers or a single comb laser, for example. A single pluggable SOA module 1403 may include a plurality of SOAs, such as SOA 1404, for example. Each optical input and output path may be coupled to a fiber using a fiber connector, such as fiber connector 1405, for example. More specifically, in one embodiment, a 51.2 Tbps switch may include 32 optical engines based on a Silicon Photonics platform using 1.6 Tbps bandwidth. In another embodiment, 16 light engines at 3.2 Tbps data rate each may be used. Such an integrated module may previously suffer from the reliability issues described above, because it contains many photonics components with high optical power and current density. However, low powered lasers shift reliability issues to the SOAs, which may be replaced in case of failure without dismounting the switch, for example. Because there is no high-speed electronics inside of the SOA module, it's cost may not be as high. Alternatively, other embodiments may have 2, 4, 8 etc. independent SOA modules to amplify different numbers of lasing lines, for example. The techniques described herein may be used to estimate the number of SOA chips/pluggable modules based on drive conditions, number of lasing lines amplified, and specific requirements of a particular network device, for example, in order to get the best combination of cost, performance, and MTBF level.

Figure 15:
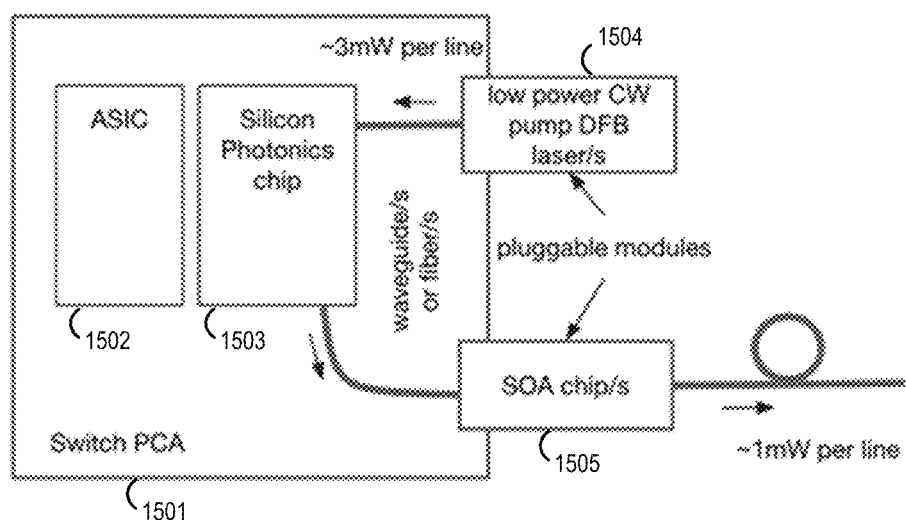
FIG. 15 illustrates another configuration of lasers and semiconductor optical amplifiers according to another embodiment.

FIG. 15 illustrates another configuration of lasers and semiconductor optical amplifiers according to another embodiment. In this example, a network switch PCA 1501 comprises an electronic data plane ASIC 1502 and a Silicon Photonics chip 1503 (e.g., with integrated optical components described above) with pluggable modules for both low power CW lasers 1504 and SOAs 1505, which may be placed on a path to the receiver of a second network switch, for example. ASIC 1502 and Silicon Photonics chip 1503 may be co-packaged optics, for example. The present example illustrates that another way to mitigate laser reliability issues in network devices is to place lasers to place the lasers in pluggable optical modules located on the panel (e.g., rather than inside the switch chassis close to the Silicon Photonics light engine). The CW light from these lasers is delivered by optical fiber or by planar waveguides (e.g., over the network device PCA) to the Silicon Photonics chip(s) placed next to the switch ASIC, modulated, and sent to pluggable SOA 1505, for example, and then to another network device.

In some embodiments, the SOA chip or multiple SOA chips may be configured on the same pluggable module as the lasers, for example. In this case, the resultant module has multiple functions: contain low power laser(s) which pump a Silicon Photonics engine, amplification of the optical signal after it has been modulated by the Silicon Photonics chip inside of the network device, and delivery of the signal to the optical fiber connected to a receiver of a second network device. The signal from a transmitter of the second network device to the receiver of the first network may also be channeled through the same pluggable module (e.g., on a second receiver path fiber). For example, the signal arrives through the optical fiber and is moved into polymer waveguides contained on the PCA of the pluggable module, for example.

Figure 16A:
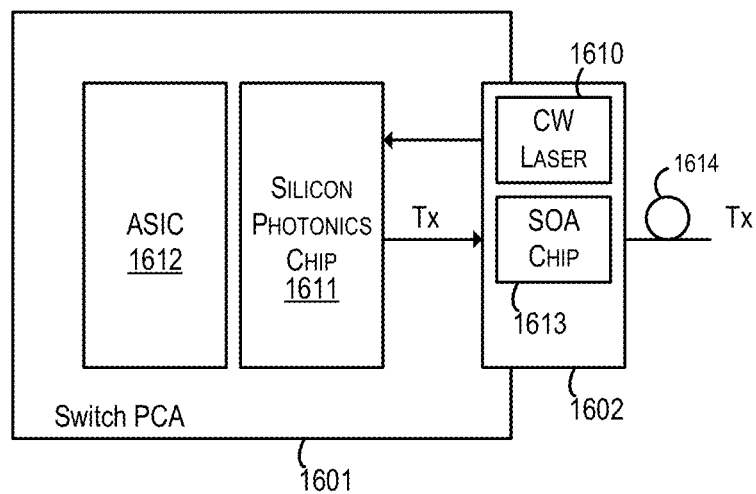
FIGS. 16A-B illustrate another network device with pluggable optics according to an embodiment.
Figure 16B:
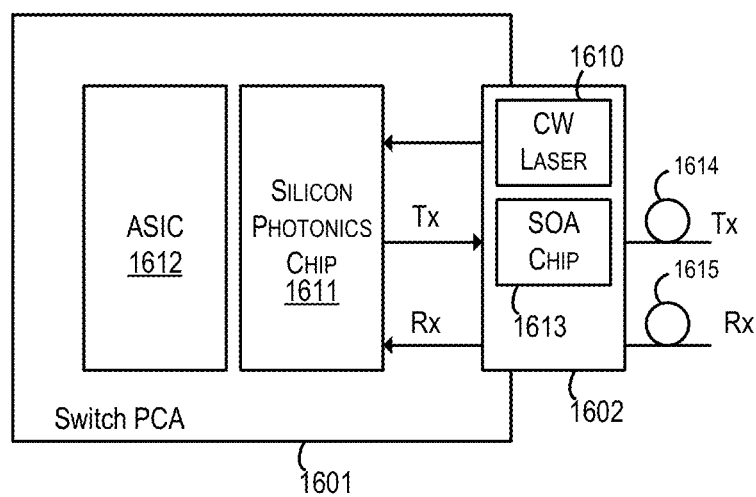

FIGS. 16A-B illustrate another network device with pluggable optics according to an embodiment. In FIG. 16A, a network switch printed circuit assembly 1601 is coupled to a pluggable module 1602 comprising both an SOA 1613 and CW laser 1610. Laser 1610 on pluggable module 1602 generates one or more wavelengths of light, which are received by a silicon photonics chip 1611 as mentioned above. Chip 1611 may be coupled to switch electronics 1612, which may be an ASIC. Modulated wavelengths may be transmitted back to module 1602 and to the input of SOA chip 1613. SOA chip 1613 has an output coupled to a fiber 1614 for transmitting (Tx) modulated optical signals to another network device. As illustrated in FIG. 16B, pluggable module 1602 may further include a receive (Rx) path via fiber 1615, as described above, for coupling received optical signals from another network device to a photodetector in silicon photonics chip 1611, for example.

FURTHER EXAMPLES

In various embodiments, the present disclosure includes systems, methods, and apparatuses for optical communications.

In one embodiment, the present disclosure includes an optical transceiver comprising: one or more continuous wave lasers configured to produce an optical signal; at least one integrated silicon optical components unit comprising at least one modulator configured to receive the optical signal from the one or more lasers; at least one semiconductor optical amplifier configured to receive the optical signal from the at least one optical components unit; and an optical fiber coupled to an output of the at least one semiconductor optical amplifier, wherein the one or more lasers are operable at a low power level corresponding to a first reliability above a target threshold, and wherein the at least one semiconductor optical amplifier increases the power level of the optical signal on its way to the optical fiber.

In one embodiment, the optical signal wavelength from the one or more lasers is around 1.3 um.

In one embodiment, the one or more continuous wave lasers include a continuous wave distributed feedback laser.

In one embodiment, the one or more continuous wave lasers include a quantum dot comb laser generating a plurality of wavelengths.

In one embodiment, the low power level is insufficient to transmit the optical signal through a full length of the optical fiber and the optical amplifier increased power is sufficient to transmit the optical signal through the full length of the optical fiber.

In one embodiment, the low power level corresponds to a mean time to failure above a first value, and wherein the semiconductor optical amplifier is configured to produce the optical signal with a second power level coupled to the optical fiber.

In one embodiment, a current density of the one or more continuous wave lasers is below 4000 A/cm$^2$ per optical output channel.

In one embodiment, at least one of said lasers is a hybrid silicon laser based on a III-V gain chip bonded on a silicon waveguide including wavelength selection elements and the power is less than 10 mW.

In one embodiment, at least one of said lasers is a continuous wave distributed feedback laser and the power is less than 10 mW.

In one embodiment, at least one of said lasers is a quantum dot comb laser and the power is less than 5 mW per channel.

In one embodiment, the one or more lasers comprise a drive current, and wherein the drive current does not exceed a threshold current multiplied by 7.

In one embodiment, at least one of said lasers is a continuous wave distributed feedback laser, and wherein a ratio of a laser output power to a semiconductor optical amplifier output power per channel is less than 20.

In one embodiment, at least one of said lasers is a continuous wave quantum dot comb laser, and wherein a ratio of a laser output power to a semiconductor optical amplifier output power per channel is less than 20.

In one embodiment, at least one of said lasers is a continuous wave quantum dot comb laser producing a plurality of wavelengths, and wherein the plurality of lasers are coupled to a single quantum dot semiconductor optical amplifier to amplify a plurality of wavelengths.

In one embodiment, a plurality of the continuous wave lasers each produce a single wavelength, and wherein the plurality of continuous wave lasers are coupled to a single quantum dot semiconductor optical amplifier to amplify a plurality of wavelengths.

In one embodiment, the laser is coupled to the semiconductor optical amplifier over an optical polarization maintaining waveguide.

In one embodiment, the semiconductor optical amplifier operates in a gain saturation regime.

In one embodiment, the optical transceiver further comprises an optical connector configured between the at least one optical components unit and the at least one semiconductor optical amplifier, wherein the semiconductor optical amplifier is pluggable.

In one embodiment, the at least one optical components unit, the optical connector, and the at least one semiconductor optical amplifier are coupled together using one or more fiber optic cables.

In one embodiment, the at least one optical components unit, the optical connector, and the at least one semiconductor optical amplifier are coupled together using one or more integrated optical waveguides.

In one embodiment, the at least one optical components unit is configured on a first planar printed circuit assembly and the at least one semiconductor optical amplifier is configured on a second planar printed circuit assembly, and wherein the optical connector is a planar optical connector.

In one embodiment, the at least one integrated silicon optical components unit and the at least one semiconductor optical amplifier are configured on a single module.

In one embodiment, the at least one semiconductor optical amplifier is bonded on top of the at least one integrated silicon optical components unit after one or more modulators in the at least one integrated silicon optical components unit.

In one embodiment, the at least one modulator is a micro-ring modulator.

In one embodiment, the at least one modulator is a Mach-Zehnder modulator.

In one embodiment, the at least one modulator is an electro-absorption modulator.

In one embodiment, the optical signal is pulse-amplitude modulated.

In one embodiment, the optical signal is quadrature amplitude modulated.

In another embodiment, the present disclosure includes an optical transceiver comprising: one or more electro-absorption modulated distributed feedback lasers configured to produce an optical signal, the one or more lasers comprising: a laser diode section configured to operate under a continuous wave (CW) condition; and an electro-absorption modulation section to generate an optical output signal; at least one semiconductor optical amplifier configured to receive the optical signal from at least one of the electro-absorption modulated distributed feedback lasers; and an optical fiber coupled to an output of the at least one semiconductor optical amplifier, wherein the one or more lasers are operable at a low power level corresponding to a first reliability above a threshold, and wherein the at least one semiconductor optical amplifier increases the power level of the optical signal on its way to the optical fiber.

In one embodiment, the optical signal from the one or more lasers is around 1.3 um.

In one embodiment, a current density of the one or more electro-absorption modulated distributed feedback lasers is below 7000 A/cm$^2$.

In one embodiment, the output power is less than 1 mW.

In one embodiment, a ratio of a laser output power to a semiconductor optical amplifier output power is less than 20.

In one embodiment, the laser is coupled to the semiconductor optical amplifier over an optical polarization maintaining waveguide.

In one embodiment, one or more electro-absorption modulated distributed feedback lasers are coupled to a single quantum dot semiconductor optical amplifier to amplify a plurality of wavelengths.

In one embodiment, the one or more electro-absorption modulated distributed feedback lasers are configured on a first planar printed circuit assembly and the at least one semiconductor optical amplifier is configured on a second planar printed circuit assembly, and wherein the optical connector is a planar optical connector.

In one embodiment, the semiconductor optical amplifier is pluggable, the optical transceiver further comprises an optical connector configured between the at least one optical components unit and the at least one semiconductor optical amplifier.

In another embodiment, the present disclosure includes a network device comprising: a chassis; one or more lasers configured to produce an optical signal; at least one integrated silicon optical components unit configured to receive the optical signal from the one or more lasers; at least one semiconductor optical amplifier configured to receive the optical signal from the at least one optical components unit; and an optical fiber coupled to an output of the at least one semiconductor optical amplifier, wherein the one or more lasers are operable at a low power level corresponding to a higher reliability, and wherein the at least one semiconductor optical amplifier increases a power level of the optical signal on its way to the optical fiber.

In one embodiment, the optical signal from the one or more lasers is around 1.3 um.

In one embodiment, the one or more lasers are configured to produce optical signals with a first power level corresponding to a mean time to failure above a first value, and wherein the at least one semiconductor optical amplifier is configured to produce the optical signal with a second power level configured to drive the optical fiber.

In one embodiment, the one or more lasers comprise a drive current, and the drive current does not exceed a threshold current multiplied by 7.

In one embodiment, the network device further comprises a plurality of sockets on the chassis, wherein the at least one semiconductor optical amplifier is pluggable into one or more of the plurality of sockets.

In one embodiment, the network device further comprises one or more integrated circuits configured to switch data, wherein a plurality of the semiconductor optical amplifiers are pluggable into the plurality of sockets, and wherein the one or more integrated circuits, the one or more lasers, and the at least one optical components unit are co-packaged in a single module.

In one embodiment, the network device further comprises a plurality of optical connectors configured in at least a portion of the plurality of sockets, each optical connector optically coupling at least one optical components unit to at least one semiconductor optical amplifier.

In one embodiment, a plurality of semiconductor optical amplifiers are configured on at least one first pluggable module configured to plug into one the plurality of sockets, and wherein the one or more lasers are configured on at least one second pluggable module.

In one embodiment, the at least one second pluggable module is configured to plug into one of the plurality of sockets.

In one embodiment, the at least one semiconductor optical amplifier and the at least one laser are configured on a first pluggable module configured to plug into one of the plurality of sockets.

In one embodiment, the one or more lasers, the at least one optical components unit, and the at least one semiconductor optical amplifier are configured on a common substrate.

In one embodiment, the network device further comprises a pluggable optical connector configured to receive an optical signal and couple the optical signal to the at least one optical components unit.

In one embodiment, the network device further comprises a planar optical connector configured to optically couple a first polymer waveguide on a first printed circuit assembly comprising the at least one optical components unit and a second polymer waveguide on a second printed circuit assembly comprising the at least one semiconductor optical amplifier.

In one embodiment, the first polymer waveguide and the second polymer waveguide are tapered to convert an optical mode of an optical signal.

In one embodiment, the optical signal is pulse-amplitude modulated.

In one embodiment, the optical signal is quadrature amplitude modulated.

In another embodiment, the present disclosure includes a network device comprising: a chassis comprising a plurality of sockets; one or more lasers configured to produce an optical signal; at least one integrated silicon optical components unit configured to receive the optical signal from the one or more lasers; and one or more optical connectors configured proximate to one or more of the plurality of sockets, wherein the optical connectors are coupled to the at least one integrated silicon optical components unit and are configured to couple to at least one pluggable semiconductor optical amplifier to receive the optical signal from the at least one integrated silicon optical components unit and produce an amplified optical signal to an optical fiber coupled to an output of the at least one semiconductor optical amplifier.

In one embodiment, the at least one integrated silicon optical components unit is configured on a first printed circuit assembly and the semiconductor optical amplifier is configured on a second printed circuit assembly, and wherein the optical connector is a planar optical connector.

In one embodiment, the at least one integrated silicon optical components unit, the optical connector, and the at least one semiconductor optical amplifier are coupled together using one or more integrated optical waveguides.

In one embodiment, the network device further comprises at least one integrated circuit for switching data, wherein the one or more lasers, the at least one integrated silicon optical components unit, and the integrated circuit for switching data are co-packaged.

In another embodiment, the present disclosure includes a method for sending data across a network comprising: generating an optical signal in one or more continuous wave lasers, wherein the one or more continuous wave lasers are operable at a low power level corresponding to a target reliability; coupling the optical signal to at least one integrated silicon optical components unit; and coupling the optical signal from the at least one integrated silicon optical components unit to at least one semiconductor optical amplifier; and coupling the optical signal from an output of the at least one semiconductor optical amplifier to an optical fiber, wherein the at least one semiconductor optical amplifier increases a power level of the optical signal of the optical signal on its way to the optical fiber.

In another embodiment, the present disclosure includes a method of sending data across a network comprising: generating an optical signal in one or more lasers; coupling the optical signal to at least one integrated silicon optical components unit; and coupling the optical signal from the at least one integrated silicon optical components unit to at least one optical connector configured proximate to at least one socket of a network device chassis, wherein the at least one optical connector is configured to couple to a pluggable semiconductor optical amplifier to receive the optical signal from the at least one integrated silicon optical components unit through the optical connector and produce an amplified optical signal to an optical fiber coupled to an output of the at least one semiconductor optical amplifier.

The above description illustrates various embodiments along with examples of how aspects of some embodiments may be implemented. The above examples and embodiments should not be deemed to be the only embodiments, and are presented to illustrate the flexibility and advantages of some embodiments as defined by the following claims. Based on the above disclosure and the following claims, other arrangements, embodiments, implementations and equivalents may be employed without departing from the scope hereof as defined by the claims.

What is claimed is:

1. An optical transceiver comprising:
   one or more continuous wave lasers configured to produce an optical signal along a transmission path toward an optical fiber;
   at least one integrated silicon optical components unit in the transmission path comprising at least one modulator configured to receive the optical signal from the one or more lasers;
   at least one quantum dot semiconductor optical amplifier in the transmission path configured to receive the optical signal from the at least one optical components unit; and
   wherein the optical fiber is coupled to an output of the at least one quantum dot semiconductor optical amplifier, and
   wherein the one or more lasers are operable at a first power level, and wherein the at least one quantum dot semiconductor optical amplifier increases the first power level of the optical signal on its way to the optical fiber.

2. The optical transceiver of claim 1 wherein an optical signal wavelength from the one or more lasers is around 1.3 µm.

3. The optical transceiver of claim 1 wherein the one or more continuous wave lasers include a continuous wave distributed feedback laser.

4. The optical transceiver of claim 1 wherein the one or more continuous wave lasers include a quantum dot comb laser generating a plurality of wavelengths.

5. The optical transceiver of claim 1 wherein the first power level is insufficient to transmit the optical signal through a full length of the optical fiber and the optical amplifier increased power is sufficient to transmit the optical signal through the full length of the optical fiber.

6. The optical transceiver of claim 1 wherein the first power level corresponds to a mean time to failure above a first value, and wherein the quantum dot semiconductor optical amplifier is configured to produce the optical signal with a second power level coupled to the optical fiber.

7. The optical transceiver of claim 1 wherein a current density of the one or more continuous wave lasers is below 4000 A/cm$^2$ per optical output channel.

8. The optical transceiver of claim 1 wherein at least one of said lasers is a hybrid silicon laser based on a III-V gain chip bonded on a silicon waveguide including wavelength selection elements and the power is less than 10 mW.

9. The optical transceiver of claim 1 wherein at least one of said lasers is a continuous wave distributed feedback laser and the power is less than 10 mW.

10. The optical transceiver of claim 1 wherein at least one of said lasers is a quantum dot comb laser and the power is less than 5 mW per channel.

11. The optical transceiver of claim 1 wherein the one or more lasers comprise a drive current, and wherein the drive current does not exceed a threshold current multiplied by 7.

12. The optical transceiver of claim 1 wherein at least one of said lasers is a continuous wave distributed feedback laser, and wherein a ratio of a laser output power to a quantum dot semiconductor optical amplifier output power per channel is less than 20.

13. The optical transceiver of claim 1 wherein at least one of said lasers is a continuous wave quantum dot comb laser, and wherein a ratio of a laser output power to a quantum dot semiconductor optical amplifier output power per channel is less than 20.

14. The optical transceiver of claim 1 wherein at least one of said lasers is a continuous wave quantum dot comb laser producing a plurality of wavelengths, and wherein the plurality of lasers are coupled to a single quantum dot semiconductor optical amplifier to amplify a plurality of wavelengths.

15. The optical transceiver of claim 1 wherein a plurality of the continuous wave lasers each produce a single wavelength, and wherein the plurality of continuous wave lasers are coupled to a single quantum dot semiconductor optical amplifier to amplify a plurality of wavelengths.

16. The optical transceiver of claim 1 wherein the laser is coupled to the semiconductor optical amplifier over an optical polarization maintaining waveguide.

17. The optical transceiver of claim 1 wherein the quantum dot semiconductor optical amplifier operates in a gain saturation regime.

18. The optical transceiver of claim 1 further comprising an optical connector configured between the at least one optical components unit and the at least one quantum dot semiconductor optical amplifier, wherein the semiconductor optical amplifier is pluggable.

19. The optical transceiver of claim 18 wherein the at least one optical components unit, the optical connector, and the at least one quantum dot semiconductor optical amplifier are coupled together using one or more fiber optic cables.

20. The optical transceiver of claim 18 wherein the at least one optical components unit, the optical connector, and the at least one quantum dot semiconductor optical amplifier are coupled together using one or more integrated optical waveguides.

21. The optical transceiver of claim 18 wherein the at least one optical components unit is configured on a first planar printed circuit assembly and the at least one quantum dot semiconductor optical amplifier is configured on a second planar printed circuit assembly, and wherein the optical connector is a planar optical connector.

22. The optical transceiver of claim 1 wherein the at least one integrated silicon optical components unit and the at least one quantum dot semiconductor optical amplifier are configured on a single module.

23. The optical transceiver of claim 22 wherein the at least one quantum dot semiconductor optical amplifier is bonded on top of the at least one integrated silicon optical components unit after one or more modulators in the at least one integrated silicon optical components unit.

24. The optical transceiver of claim 1 wherein the at least one modulator is a micro-ring modulator.

25. The optical transceiver of claim 1 wherein the at least one modulator is a Mach-Zehnder modulator.

26. The optical transceiver of claim 1 wherein the at least one modulator is an electro-absorption modulator.

27. The optical transceiver of claim 1 wherein the optical signal is pulse-amplitude modulated.

28. The optical transceiver of claim 1 wherein the optical signal is quadrature amplitude modulated.

29. An optical transceiver comprising:
one or more electro-absorption modulated distributed feedback lasers configured to produce an optical signal along a transmission path toward an optical fiber, the one or more lasers comprising:
 a laser diode section configured to operate under a continuous wave (CW) condition; and
 an electro-absorption modulation section to generate an optical output signal;
at least one quantum dot semiconductor optical amplifier in the transmission path configured to receive the optical signal from at least one of the electro-absorption modulated distributed feedback lasers; and
wherein the optical fiber is coupled to an output of the at least one semiconductor optical amplifier, and
wherein the at least one semiconductor optical amplifier increases the power level of the optical signal on its way to the optical fiber.

30. The optical transceiver of claim 29 wherein the optical signal from the one or more lasers is around 1.3 um.

31. The optical transceiver of claim 29 wherein a current density of the one or more electro-absorption modulated distributed feedback lasers is below 7000 A/cm$^2$.

32. The optical transceiver of claim 29 wherein the output power is less than 1 mW.

33. The optical transceiver of claim 29 wherein a ratio of a laser output power to a quantum dot semiconductor optical amplifier output power is less than 20.

34. The optical transceiver of claim 29 wherein the laser is coupled to the quantum dot semiconductor optical amplifier over an optical polarization maintaining waveguide.

35. The optical transceiver of claim 29 wherein one or more electro-absorption modulated distributed feedback lasers are coupled to a single quantum dot semiconductor optical amplifier to amplify a plurality of wavelengths.

36. The optical transceiver of claim 29 wherein the one or more electro-absorption modulated distributed feedback lasers are configured on a first planar printed circuit assembly and the at least one quantum dot semiconductor optical amplifier is configured on a second planar printed circuit assembly.

37. The optical transceiver of claim 29 wherein the quantum dot semiconductor optical amplifier is pluggable.

38. The optical transceiver of claim 37 further comprising an optical connector configured between at least one optical components unit and the at least one quantum dot semiconductor optical amplifier.

39. A method for sending data across a network comprising:
generating an optical signal in one or more continuous wave lasers along a transmission path toward an optical fiber;
coupling the optical signal to at least one integrated silicon optical components unit in the transmission path; and
coupling the optical signal from the at least one integrated silicon optical components unit to at least one quantum dot semiconductor optical amplifier in the transmission path; and
coupling the optical signal from an output of the at least one quantum dot semiconductor optical amplifier to an optical fiber, wherein the at least one quantum dot semiconductor optical amplifier increases a power level of the optical signal of the optical signal on its way to the optical fiber.

40. The method of claim 39 wherein the quantum dot semiconductor optical amplifier is pluggable.

41. The method of claim 39 wherein the optical signal from the one or more lasers is around 1.3 μm, and wherein a current density of the one or more continuous wave lasers is below 4000 A/cm$^2$ per optical output channel.

* * * * *